(12) United States Patent
Ma et al.

(10) Patent No.: US 7,626,822 B2
(45) Date of Patent: Dec. 1, 2009

(54) HEAT SINK ASSEMBLY FOR MULTIPLE ELECTRONIC COMPONENTS

(75) Inventors: Wu-Jiang Ma, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1 day.

(21) Appl. No.: 11/955,316

(22) Filed: Dec. 12, 2007

(65) Prior Publication Data

US 2009/0154110 A1 Jun. 18, 2009

(51) Int. Cl.
*H05K 7/20* (2006.01)
*F28F 7/00* (2006.01)
*H01L 23/34* (2006.01)

(52) U.S. Cl. .................. 361/719; 165/80.2; 165/185; 257/719

(58) Field of Classification Search .................. 257/719; 361/719
See application file for complete search history.

(56) References Cited

U.S. PATENT DOCUMENTS

| | | | | |
|---|---|---|---|---|
| 3,277,346 A | * | 10/1966 | McAdam et al. | 361/697 |
| 4,730,235 A | * | 3/1988 | Newton | 361/708 |
| 6,049,459 A | * | 4/2000 | Edmonds et al. | 361/707 |
| 6,381,137 B1 | * | 4/2002 | Kato et al. | 361/704 |
| 6,545,879 B1 | * | 4/2003 | Goodwin | 361/807 |
| 6,680,848 B2 | * | 1/2004 | Petit et al. | 361/704 |
| 6,958,914 B2 | * | 10/2005 | Hoss | 361/704 |
| 7,262,969 B2 | * | 8/2007 | Lee et al. | 361/704 |
| 7,283,368 B2 | * | 10/2007 | Wung et al. | 361/719 |
| 7,342,795 B2 | * | 3/2008 | Lee et al. | 361/719 |
| 7,428,154 B2 | * | 9/2008 | Ishimine et al. | 361/704 |
| 2007/0091578 A1 | * | 4/2007 | Chang et al. | 361/719 |

* cited by examiner

*Primary Examiner*—Gregory D Thompson
(74) *Attorney, Agent, or Firm*—Frank R. Niranjan

(57) ABSTRACT

A heat sink assembly for removing heat from a plurality arrays of heat generating-components mounted on a printed circuit board includes a fist and a second heat sink, a plurality of fastening assemblies. Each of the first and second heat sinks comprises an elongated base and a plurality of fins mounted on the base. The base extends beyond the fins at two lateral sides of the fins to form a first shoulder and a second shoulder located above the first shoulder in a manner such that the second shoulder of the first heat sink is superposed on the first shoulder of the second heat sink. The fastener assembly extends through the superposed first and second shoulders of the first and second heat sinks to assemble the first and second heat sinks on the printed circuit board.

14 Claims, 6 Drawing Sheets

HEAT SINK ASSEMBLY FOR MULTIPLE ELECTRONIC COMPONENTS

BACKGROUND OF THE INVENTION

1. Field of the Invention

The present invention relates generally to a heat sink assembly, and more particularly to a heat sink assembly adapted for removing heat from multiple electronic heat-generating components of differing heights.

2. Description of Related Art

Electronic component includes numerous circuits operating at high speed and generating substantial heat. In many applications, it is desirable to employ a heat sink to remove heat from electronic heat-generating components, such as central processing units (CPUs) etc., to assure that the components function properly and reliably. A typical heat sink comprises a base for contacting with the heat-generating component to absorb the heat originated from the heat-generating component and a plurality of parallel planar fins attached to the base by soldering or adhering. Alternatively, the fins can be integrally formed with the base by metal extrusion, such as aluminum extrusion. The fins are used for dissipating the heat to ambient air.

With the development of various types of electronic modules, an array of many discrete components may be mounted to a surface of a single circuit board. In some circumstances, more than one of the components must be cooled. Since the components are generally of different heights and their top surfaces are thus at different levels, conventional heat sinks cannot meet the requirement to intimately contact with the top surfaces of the components simultaneously to remove the heat from all the components. Thus, more than one of individual heat sinks need to be employed to remove heat from each component. Accordingly, a large amount of space is required to install the heat sinks, thus restricting space for other components; furthermore, it is both expensive and time-consuming to attach individual heat sinks to each component.

What is needed is a heat sink assembly with an improved structure able to cool an array of components with different heights.

SUMMARY OF THE INVENTION

A heat sink assembly for removing heat from a plurality arrays of heat generating-components mounted on a printed circuit board includes a fist and a second heat sink, a plurality of fastening assemblies. Each of the first and second heat sinks comprises an elongated base and a plurality of fins mounted on the base. The base extends beyond the fins at two lateral sides of the fins to form a first shoulder and a second shoulder located above the first shoulder in a manner such that the second shoulder of the first heat sink is superposed on the first shoulder of the second heat sink. The fastener assembly extends through the superposed first and second shoulders of the first and second heat sinks to assemble the first and second heat sinks on the printed circuit board.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
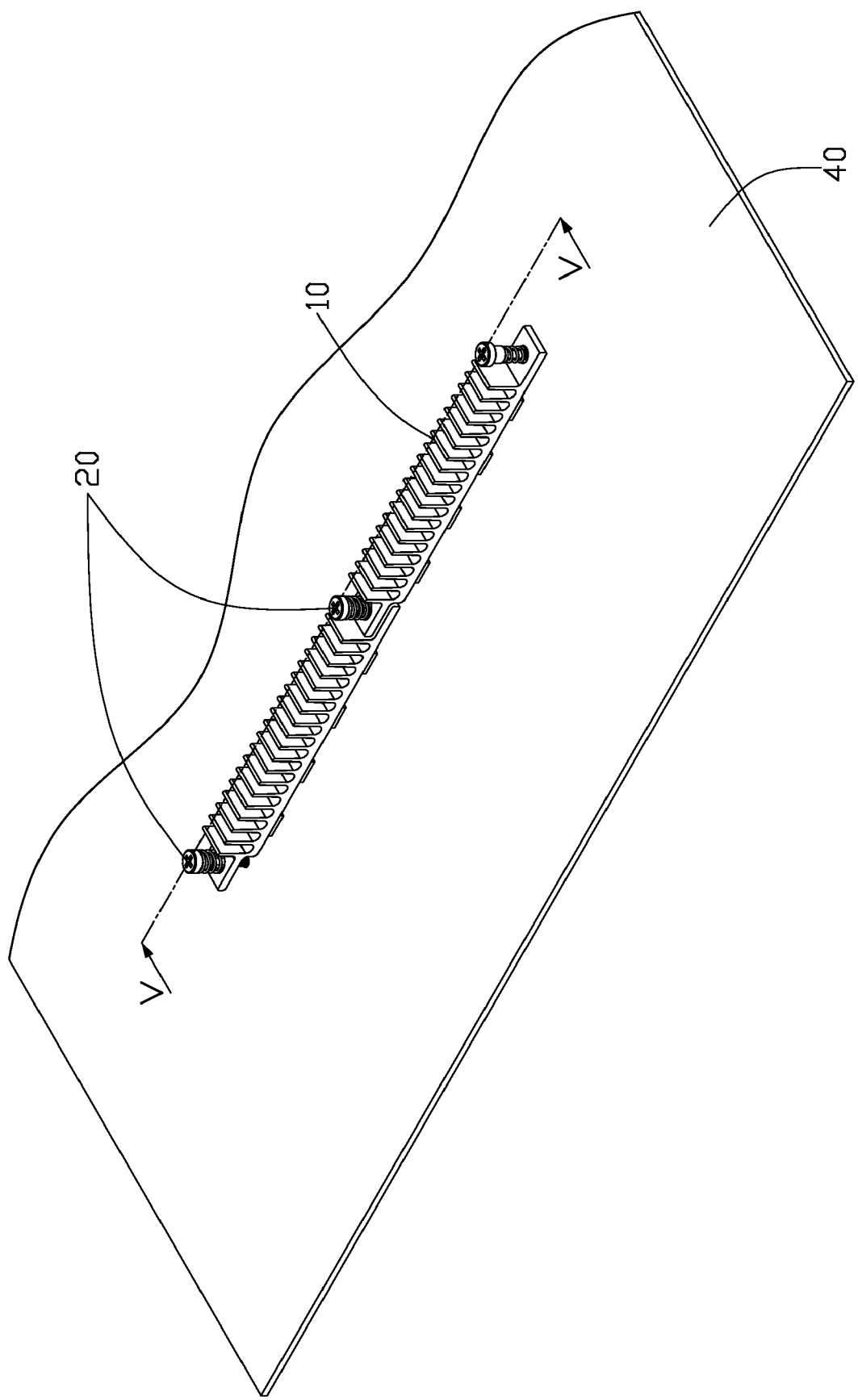
FIG. 1 is an assembled isometric view of a heat sink assembly in accordance with a preferred embodiment of the present invention.
Figure 2:
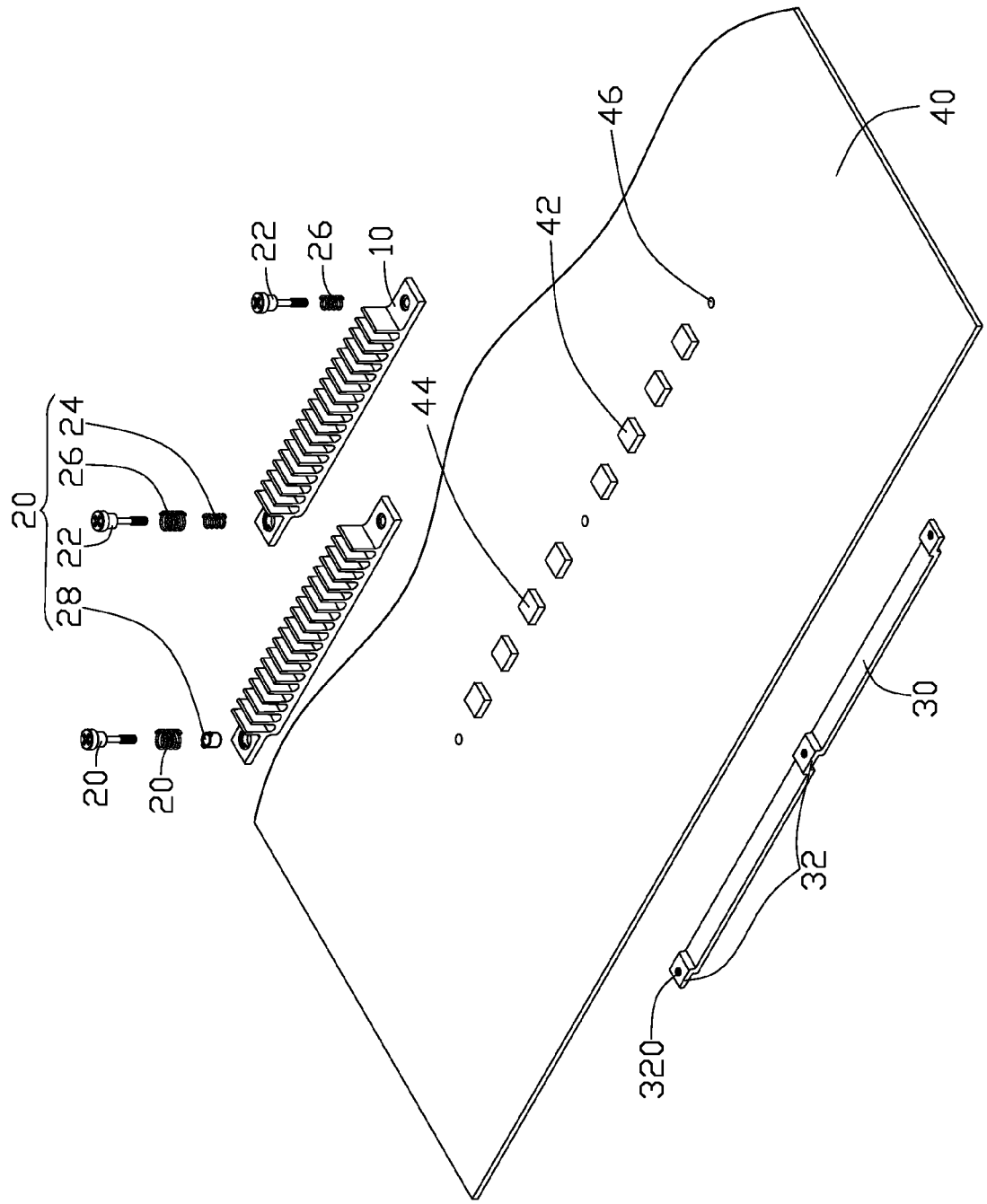
FIG. 2 is an exploded, isometric view of FIG. 1.

Referring to FIGS. 1 and 2, a heat sink assembly in accordance with a preferred embodiment of the invention is adapted for dissipating heat from multiple arrays of heat-generating components 42, 44 mounted on a printed circuit board 40. The heat sink assembly comprises two heat sinks 10, a plurality of fastening assemblies 20 fixing the heat sinks 10 on the printed circuit board 40 and a back plate 30 secured beneath the printed circuit board 40 for engaging with the fastening assemblies 20.

The arrays of heat-generated components 42 are mounted on the printed circuit board 40 in alignment in this embodiment. Top surfaces of different arrays of heat can be in different level. The Fixing holes 46 are respectively provided two opposite lateral sides of and between the two arrays of the heat-generating components 42, 44.

Figure 3:
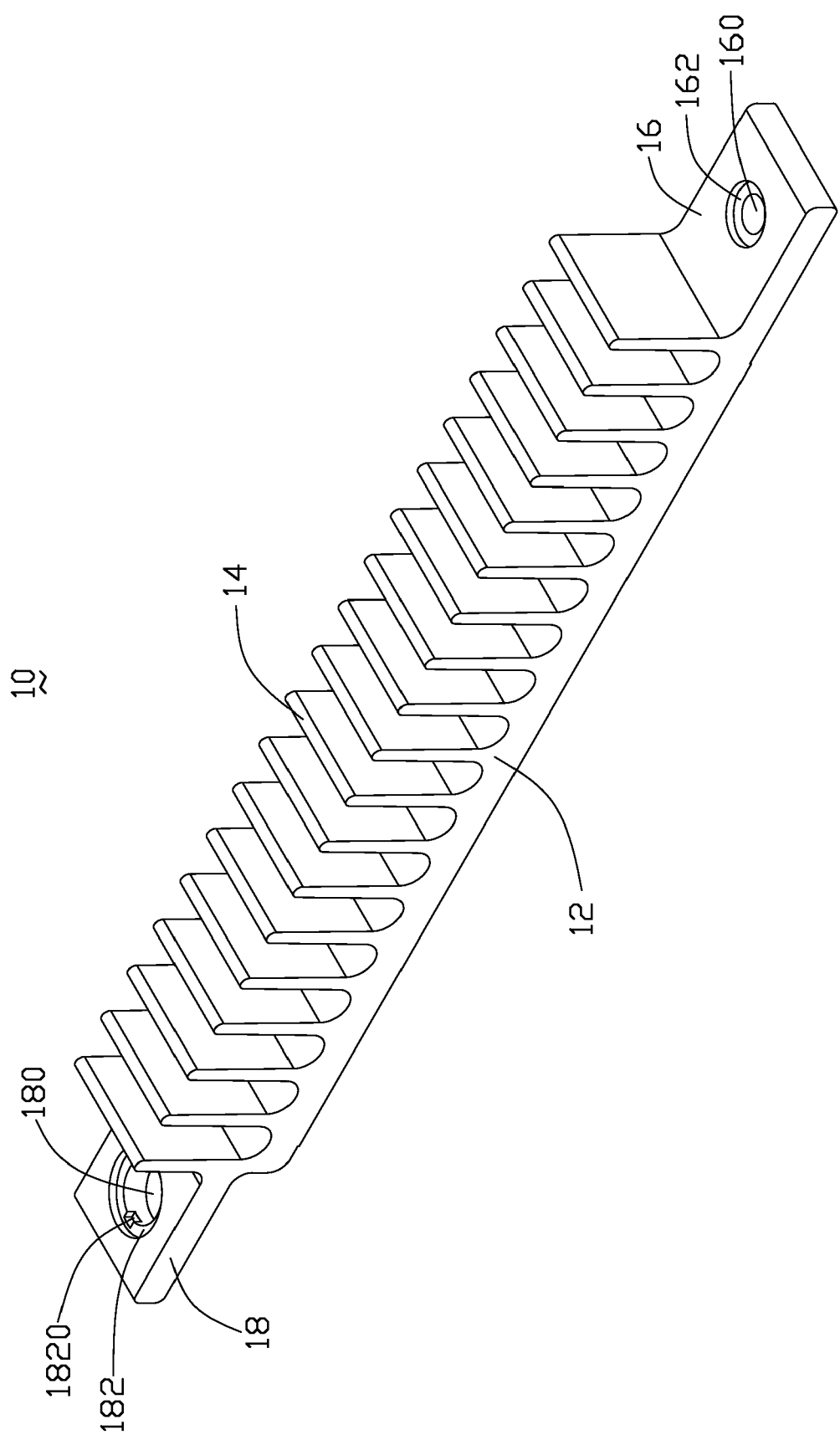
FIG. 3 is an enlarged view of a heat sink in FIG. 2.

Also referring to FIG. 3, the heat sink 10 is integrally made of a thermally conductive metal such as aluminum, and comprises a rectangular and elongated base 12 whose bottom surface intimately contacts with one array of the heat-generating components 42, a plurality of parallel fins 14 extending perpendicularly from the base plate 12 and first and second rectangular shoulders 16, 18 at two lateral sides of the heat sink 10. The first shoulder 16 whose bottom surface is coplanar with the bottom surface of the base plate 12 extends horizontally from a lateral side of the base plate 12 and has a thickness equal to that of the base plate 12 and the second shoulder 18. The second shoulder 18 extends horizontally from another lateral side of a corresponding outermost fin 14 of the heat sink 10. A bottom surface of the second shoulder 18 is in a level little higher than a top surface of the base plate 12 and the first shoulder 16, such that the second shoulder 18 of one heat sink 10 can be disposed on the first shoulder 16 of another adjacent heat sink 10. The first and second shoulders 16, 18 respectively define a first through hole 160 and a second through hole 180 therein. The first shoulder 16 has an annular first step portion 162 protruding inwardly from a lower inner edge of the first through hole 180. The second shoulder 18 has an annular second step portion 182 protruding inwardly from a lower inner edge of the second through hole 180. Two cutouts 1820 facing each other are recessed from the second step portion 182 and are located at two opposite positions of an inner edge of the second step portion 182. The first through hole 160 is aligned with the corresponding second through hole 180 when the second shoulder 18 of one heat sink 10 is disposed on the first shoulder 16 of another adjacent heat sink 10. The second step portion 182 in the second shoulder 18 has an inner diameter equal to that of the first through hole 160 of the first shoulder 16 (clearly shown in FIG. 6).

Figure 4:
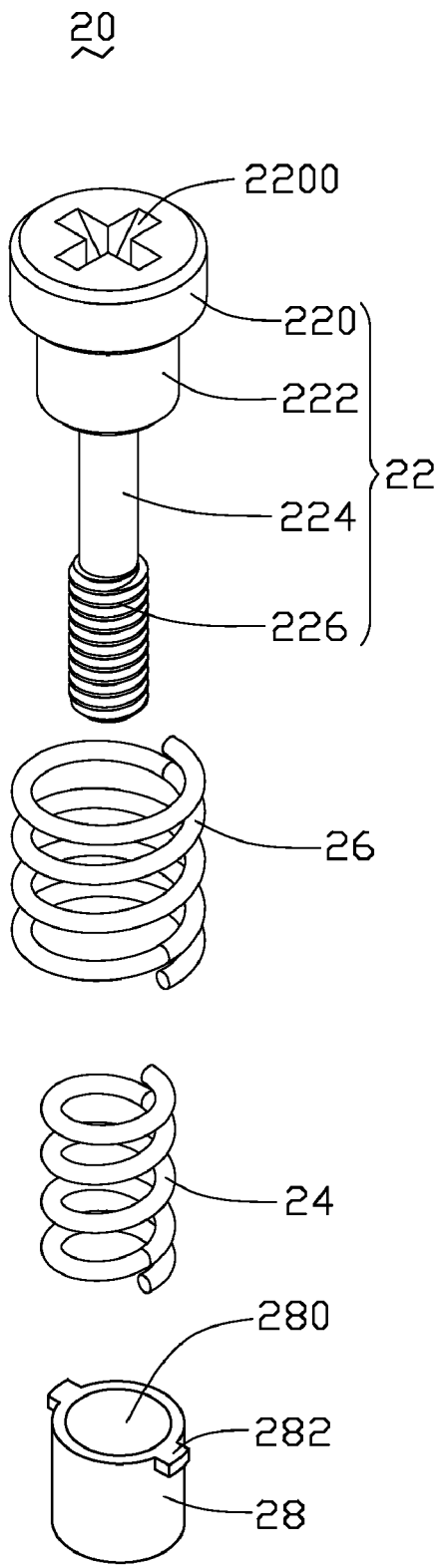
FIG. 4 is an enlarged, exploded view of a fastening assembly in FIG. 2.

As shown in FIG. 4, each of the fastening assemblies 20 comprises a fixture 22 received in the first and second through holes 160, 180 of two adjacent heat sinks 10, a first spring 24 encircled the fixture 22, a second spring 26 encircled the first spring 24 and a sleeve 28 engaged in the second through hole 180 of the heat sink 10. The fixture 22 has a circular head 220 at a top thereof, a column 222 extending downwardly from the head 220, a shaft 224 extending downwardly from a bottom end of the column 222 and an engaging portion 226 connected to the shaft 224 at a bottom end thereof. The head 220 at a top thereof defines a cross-shaped slot 2200 therein for positioning a tool (not shown), such as a screwdriver. The column 222 has an outer diameter smaller than that of the head 220 and bigger than that of the shaft 224. The engaging portion 226 forms outer screw threads for engaging with the back plate 30.

The first spring 24 encircling the shaft 224 is received in the first and second though holes 160, 180 of the first and second shoulders 16, 18 of the two adjacent heat sinks 10. The first spring 24 has an inner diameter larger than that of first step portion 162 of the first shoulder 16 and smaller than the outer diameter of the column 222 of the fixture 22 in a manner such that the first spring 24 snugly encircled the shaft 224 is compressed between a bottom surface of the column 222 and a top surface of the first step portion 162 when the fixture 22 is received in the corresponding first and second through holes 160, 180 of the two adjacent heat sinks 10. The second spring 26 is encircled the column 222 of the fixture 22 of the fastener assembly 20 and around the first spring 24. The second spring 26 has an inner diameter larger than that of the second step portion 182 of the second shoulder 18 and smaller than the outer diameter of the head 220 of the fixture 22 in a manner such that the second spring 26 snugly encircled the column 222 is compressed between a bottom surface of the head 220 and a top surface of the second step portion 182 when the fixture 22 is received in the corresponding first and second through holes 160, 180 of the two adjacent heat sinks 10.

The sleeve 28 is integrally formed of plastic and defines an extending hole 280 therein for receiving the shaft 224 therein. The sleeve 28 is used to the second shoulder 18 which is not supposed to be connected to the first shoulder 16 of other heat sink 10 in order to decrease unwanted space in the second through hole 180 for avoiding swaying of the shaft 224 in the second through hole 180, which means no matter how many heat sinks 10 is used, there is only one sleeve 28 is needed received in the second through hole 180 located at an outermost side of the heat sinks 10. The sleeve 28 has two protrusions 282 extending outwardly from two opposite top portions of a circumference thereof. When the sleeve 28 is received in the second through 180, the protrusions 282 are engaged in the two cutouts 1820 to secure the sleeve 28 and top surfaces of the protrusions 282 and the sleeve 28 are coplanar with the step portion 182. A bottom of the sleeve 28 extends beyond the second through hole 180 of the heat sink 10.

The back plate 30 is rectangular and attached to a bottom of the printed circuit board 40. A plurality of platforms 32 are protruded from the back plate 30 by punching upwardly and spaced from each other with a distance equal to that between the first and second shoulders 16, 18 of the two adjacent heat sinks 10. The platform 32 is pressed on the bottom of the printed circuit board 40 and defines an engaging hole 320 therein for providing passage of the engaging portion 226 of the fixture 22.

Figure 5:
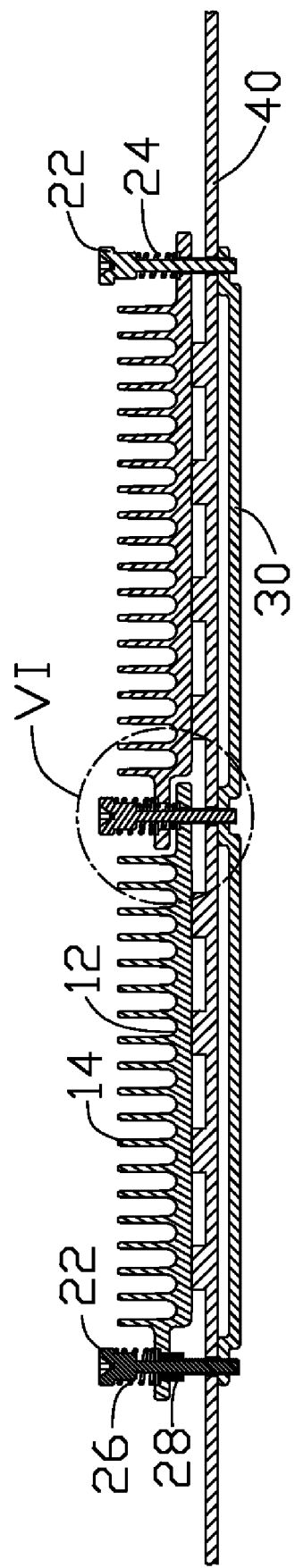
FIG. 5 is a cross section view along line V-V in FIG. 1.
Figure 6:
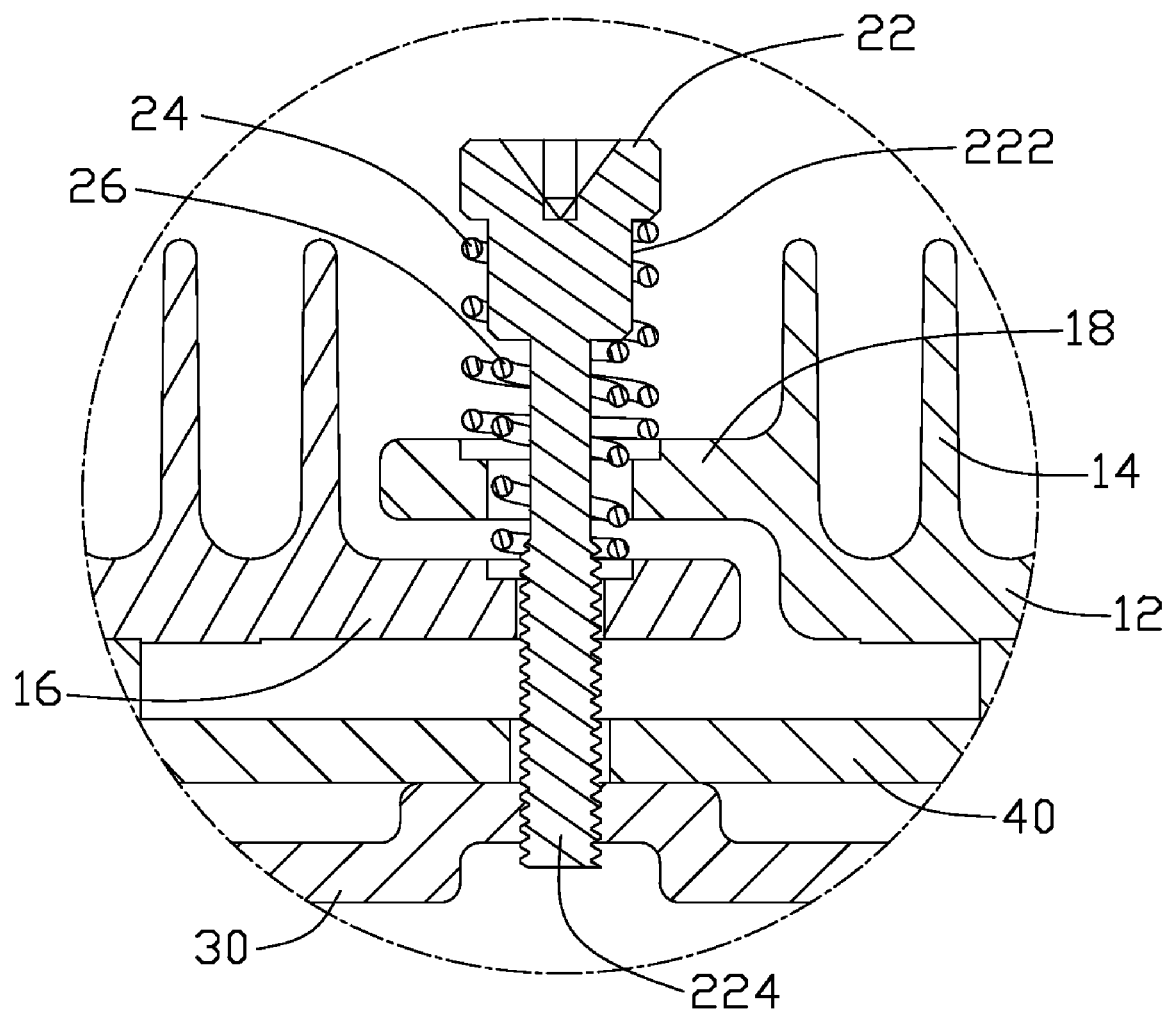
FIG. 6 is an enlarged view of a circled portion VI of FIG. 5.

Also referring to FIGS. 5-6, in assembly of the heat sink assembly to the two arrays of heat-generating components 42, 44 on the printed circuit board 40, the two heat sinks 10 are respectively placed on the two arrays of heat-generating components 42, 44, and the second shoulder 18 of one heat sink 10 is disposed on the first shoulder 16 of another adjacent heat sink 10 with the corresponding first and second through holes 160, 180 in alignment with each other. The fixture 22 wearing the first and second springs 24, 26 extends through the corresponding second through hole 180, first through hole 160 and the fixing hole 46 of the printed circuit board 40 between the two arrays of heat-generating components 42, 44 in sequence, and is then screwed into the corresponding engaging hole 320 of the back plate 30 under the printed circuit board 40. The fixture 22 wearing the first spring 24 is extended through the first through hole 160 of the first shoulder 16 at an end of the heat sink assembly and the corresponding fixing hole 46 of the printed circuit board 40 in sequence, and is then screwed into the corresponding engaging hole 320 of the back plate 30. The fixture 22 wearing the second spring 26 extends through the sleeve 28 which is locked in the second through hole 180 of the second shoulder 18 at another end of the heat sink assembly and the corresponding fixing hole 46 of the printed circuit board 40 in sequence, and is then screwed into the corresponding engaging hole 320 of the back plate 30. The heat sink assembly is thus securely mounted to the two arrays of heat-generating components 42, 44.

As the diameter of the first spring 24 is smaller than that of the second spring 26, the first spring 24 and the second spring 26 are respectively compressed between the bottom of the column 224 of the fixture 22 and the step portion 162 of the first shoulder 16 of the heat sink 10, and between the bottom of the head 220 of the fixture 22 and the second step portion 182 of the second shoulder 18 of the heat sink 10. The first and second springs 24, 26 encircling on the same fixture 22 will not interfere with each other and work independently. The first shoulder 16 or the second shoulders 18 is depressed toward the heat-generating components 42, 44 by single one of the first and second springs 24, 26, thus if the heat sink assembly is used properly, weight of one of the heat sink 10 will not fall on another one of the heat sink 10. In other world, the heat sink assembly can main sure that each heat sink 10 intimately contacts with the corresponding array of heat-generating components 42/44 and also avoids each array of heat-generating components 42/44 suffering an excess burden from other heat sink 10.

It is easy to be understood, in some embodiment of the present invention, the heat assembly can includes more than two heat sinks 10, every two of the heat sinks 10 can be connected together and mounted to the corresponding arrays of heat-generating components 42, 44 in a way as described above.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat sink assembly for removing heat from a plurality of arrays of heat generating-components mounted on a printed circuit board, comprising:

two heat sinks each attached to one individual array of the heat-generating components, each of the heat sinks having a first shoulder and a second shoulder respectively extending from two opposite lateral sides thereof;

a fixture comprising a head and a shaft extending perpendicularly from the head;

a first spring snugly encircling the shaft; and a second spring encircling the shaft and surrounding the first spring;

wherein the fixture further comprises a column between the head and the shaft, and a diameter of the column is larger than that of the shaft and smaller than that of the head;

wherein the first and second shoulders respectively define a first and second through holes therein;

wherein the second shoulder of one of the two heat sinks is disposed on the first shoulder of another of the two heat sinks, the fixture extends through the second and the first through holes, the first spring is compressed between the column and the first shoulder, the second spring is compressed between the head and the second shoulder and a top of the second spring is located above a top of the first spring.

2. The heat sink assembly as claimed in claim 1, wherein a bottom surface of the second shoulder is in a level higher than a top surface of the first shoulder.

3. The heat sink assembly as claimed in claim 1, wherein each of the first and second shoulders respectively form first and second annular step portions at lower inner edges of the first and second through holes, and the second step portion of the second shoulder has an inner diameter equal to that of the first through hole of the first shoulder.

4. The heat sink assembly as claimed in claim 3, wherein the first spring is compressed between a bottom of the column of the fixture and the first step portion, and the second spring is compressed between a bottom of the head of the fixture and a top of the second step portion.

5. The heat sink assembly as claimed in claim 1, wherein the first spring is depressed by a bottom of the column and compressed between the column and the first shoulder.

6. The heat sink assembly as claimed in claim 3, further comprising a sleeve, wherein the sleeve defines an extending hole therein and two protrusions extending outwardly from two opposite portions of a circumference thereof, and the second shoulder of the another of the two heat sinks which is at an end of the heat sink assembly distant from the one of the two heat sinks and not connected to the first shoulder of the one of the two heat sinks, defines two cutouts in the second step portion of the second through hole thereof, and the two protrusions of the sleeve are engaged in the two cutouts to thereby secure the sleeve in the second through hole of the second shoulder of the another of the two heat sinks.

7. The heat sink assembly as claimed in claim 6, further comprising a back plate secured beneath the printed circuit board, and a lower end of the shaft defines an engaging portion which extends through the printed circuit board to screw into the back plate.

8. A heat sink assembly for removing heat from multiple heat generating-components mounted on a printed circuit board comprising:

a first heat sink and a second heat sink, each of the first and second heat sinks comprising an elongated base and a plurality of fins mounted on the base, the base extending beyond the fins at two lateral sides of the fins to form a first shoulder and a second shoulder located above the first shoulder in a manner such that the second shoulder of the first heat sink is superposed on the first shoulder of the second heat sink, and the first and second shoulders respectively define a first and second through holes therein; and a fastener assembly;

wherein the fastener assembly comprises a fixture, a first spring and a second spring, wherein the fixture comprises a head and a shaft extending perpendicularly from the head, and the first spring snugly encircles the shaft, and the second spring encircles the shaft and surrounds the first spring, and the fixture extends through the first and second through holes of the superposed first and second shoulders to assemble the first and second heat sinks on the printed circuit board.

9. The heat sink assembly as claimed in claim 8, wherein the second spring is compressed between the head and the second shoulder.

10. The heat sink assembly as claimed in claim 9, wherein the first and second shoulders respectively form first and second annular step portions at lower inner edges of the first and second through holes, and the second step portion of the second shoulder has an inner diameter equal to that of the first through hole of the first shoulder.

11. The heat sink assembly as claimed in claim 10, wherein the fixture further comprises a column between the head and the shaft, and a diameter of the column is larger than that of the shaft and smaller than that of the head, and the first spring is compressed between the column and the first shoulder.

12. The heat sink assembly as claimed in claim 11, wherein the first spring is depressed by a bottom of the column and compressed between the column and the first step portion and the second spring is compressed between the head and the second step portion.

13. The heat sink assembly as claimed in claim 12 further comprising a second fastener assembly encircled by another first spring, the second fastener assembly extending through the first through hole of the first shoulder of the first heat sink, and a third fastener assembly encircled by another second spring, the third fastener assembly extending through the second through hole of the second shoulder of the second heat sink.

14. The heat sink assembly as claimed in claim 13, wherein the third fastener assembly comprises a sleeve, and the sleeve defines an extending hole therein and two protrusions extending outwardly from two opposite portions of a circumference thereof, wherein the second shoulder of the second heat sink defines two cutouts in the second step portion of the second through hole, and the two protrusions of the sleeve are engaged in the two cutouts to thereby secure the sleeve in the second through hole of the second shoulder of the second heat sink.

* * * * *